United States Patent
Keum et al.

(10) Patent No.: US 6,720,533 B2
(45) Date of Patent: Apr. 13, 2004

(54) HEATER ASSEMBLY FOR HEATING A WAFER

(75) Inventors: Gyeong-Su Keum, Suwon-si (KR); Hyung-Sik Hong, Suwon-si (KR); Chung-Hun Park, Suwon-si (KR); Eun-Seok Song, Seoul (KR); Jae-Han Park, Suwon-si (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/216,913

(22) Filed: Aug. 13, 2002

(65) Prior Publication Data

US 2003/0047555 A1 Mar. 13, 2003

(30) Foreign Application Priority Data

Aug. 28, 2001 (KR) ........................................ 2001-51930

(51) Int. Cl.[7] .............................................. F27D 11/00
(52) U.S. Cl. .................. 219/444.1; 219/443.1; 219/462.1; 219/465.1; 219/448.1; 219/467.1; 392/418; 118/724; 118/725; 118/500
(58) Field of Search ................. 219/390, 405, 219/411, 443.1, 444.1, 448.11, 451.1, 462.1–463.1, 465.1, 467.1, 466.1, 476–478, 480, 482–484, 521; 392/416, 418; 118/724, 725, 500

(56) References Cited

U.S. PATENT DOCUMENTS

| 5,059,770 A | * | 10/1991 | Mahawili ..................... 219/391 |
| 5,294,778 A | * | 3/1994 | Carman et al. ............. 219/385 |
| 6,031,211 A | | 2/2000 | Mailho et al. |

FOREIGN PATENT DOCUMENTS

JP       9-7741      1/1997

* cited by examiner

Primary Examiner—Shawntina Fuqua
(74) Attorney, Agent, or Firm—Volentine Francos, PLLC (57) ABSTRACT

A heater assembly of a semiconductor device manufacturing apparatus minimizes a temperature difference between a peripheral portion and a central portion of the wafer being processed in the apparatus. The heater assembly includes a unitary resistive heating member in the form of a disc, heat blocks that divide the peripheral portion and central portion of the upper surface of the disc into respective heating sections, a support for supporting the heating member, and an electric power source for supplying electric current to the unitary heating member. The widths of the heating sections become greater towards the center of the heater, and thus the electrical resistance of the heater also increases in a direction towards the center of the heater. The power source for the heater includes a lead that extends from the bottom surface of the heater to a bottom portion of the heater support.

12 Claims, 11 Drawing Sheets

HEATER ASSEMBLY FOR HEATING A WAFER

BACKGROUND OF THE INVENTION

1. Field of the Invention

The present invention relates to the manufacturing of semiconductor devices. More particularly, the present invention relates to a heater assembly for heating a wafer.

2. Description of the Related Art

Generally, a semiconductor device is manufactured by forming a minute electronic circuit pattern on a substrate. The circuit pattern comprises a great number of electronic elements and wiring connecting the electronic elements.

More specifically, a silicon wafer, namely, a small thin circular slice of pure silicon, is produced from an ingot of crystalline silicon. Then, an electronic circuit is formed on a surface of the wafer (wafer fabrication, FAB process), the wafer is cut into a plurality of individual chips, and each chip is combined with a lead frame. An operating test is then performed on the chip to ensure that the semiconductor device is fully functional.

In the FAB process, a thin film is formed on the surface of the wafer, and the thin film is patterned to form an electronic circuit for performing a specific function. Hence, if the thickness of the thin film is not uniform over the entire surface of the wafer, a residual stress occurs on the surface of the wafer. As a result, the integrated circuit may not be formed properly.

The rate at which the material constituting the thin film layer is deposited on the wafer is greatly dependent on the temperature of the wafer. Specifically, assuming all other deposition conditions to be the same, the thin film is formed more quickly and hence, more thickly, on a wafer surface at a high temperature than at a low temperature. The deposition process of forming the thin film is carried out while the wafer is repeatedly heated and cooled. Accordingly, the temperature varies across the wafer surface, especially between a peripheral portion and a central portion of the wafer. Thus, the thin film may be formed non-uniformly over the wafer surface. Stress will occur at the boundary where the thickness of the film changes. The stress deforms the thin film, which phenomenon is referred to as "a slip phenomenon". Consequently, an IC patterned on the deformed thin film may lose its functional stability. That is, temperature uniformity is an essential factor for fabricating a semiconductor device having functional stability. In consideration of the recent trend in semiconductor technology for devices having higher degrees of integration acquired through reducing the critical dimension of the circuit patterns thereof, the temperature uniformity of the wafer surface is increasing in importance as a processing condition to be established during the semiconductor device manufacturing process.

Chemical vapor deposition (CVD) is the method usually used for forming the thin film in the semiconductor device manufacturing process. Thermal CVD is being used more frequently for forming such thin films. In thermal CVD, material is deposited by means of heat-induced chemical reactions of reactant gases supplied to a surface of a heated wafer. The thermal CVD process are classified into atmospheric pressure CVD (APCVD) and low pressure CVD (LPCVD) processes on the basis of the pressure in the CVD apparatus. LPCVD is especially suitable for depositing a metal silicide having a high melting point to form a polycide that is generally used as a wiring material of a highly integrated circuit device.

The LPCVD apparatus includes a susceptor for supporting and fixing a wafer on an upper surface thereof, and a heater disposed below the susceptor for providing heat to the susceptor. That is, the heat generated by the heater radiates to the susceptor and is conducted from the susceptor to the wafer. Therefore, the temperature of the wafer surface is dependent on the amount of heat conducted from the susceptor, and the conducted heat from the susceptor is mainly dependent on the amount of heat radiating from the heater. That is, the temperature of wafer surface is mainly dependent on the amount of heat radiating from the heater.

However, even though equal amounts of heat radiate to the peripheral portion and the central portion of the wafer from the heater, the surface temperature at the peripheral portion of the wafer is lower than that at the central portion of the wafer because a significant amount of heat is lost at a side surface of the peripheral portion of the wafer whereas most of the heat is conserved at the central portion of the wafer. Consequently, the surface temperature of the wafer is much lower at the peripheral portion than at the central portion of the wafer.

Various attempts have been made to structure the heater to decrease the temperature difference between the various surface portions of the wafer. For example, U.S. Pat. No. 6,031,211 entitled "ZONE HEATING SYSTEM WITH FEEDBACK CONTROL SYSTEM" discloses a heating system and method for producing temperature uniformity at the surface of the wafer. The disclosed heating system includes a plurality of heating sections that are controlled independently to generate different amounts of heat used for heating respective portions of the wafer. Furthermore, a heater assembly of a GENUS 7000 (trade name) CVD apparatus made by GENUS Co. Ltd. U.S.A, which is a widely used thermal CVD apparatus, includes an inner heater for heating a central portion of a susceptor and an outer heater for heating a peripheral portion of the susceptor. The inner heater and outer heater are discrete from each other and are respectively controlled to generate more heat at the peripheral portion than at the central portion. Accordingly, heat loss at the side surface of the peripheral portion of the wafer is compensated for by the outer heater, in an attempt to produce temperature uniformity on the surface of the wafer.

However, the dual heater system does not produce such temperature uniformity even when the outer heater is generating more heat than the inner heater.

Figure 1:
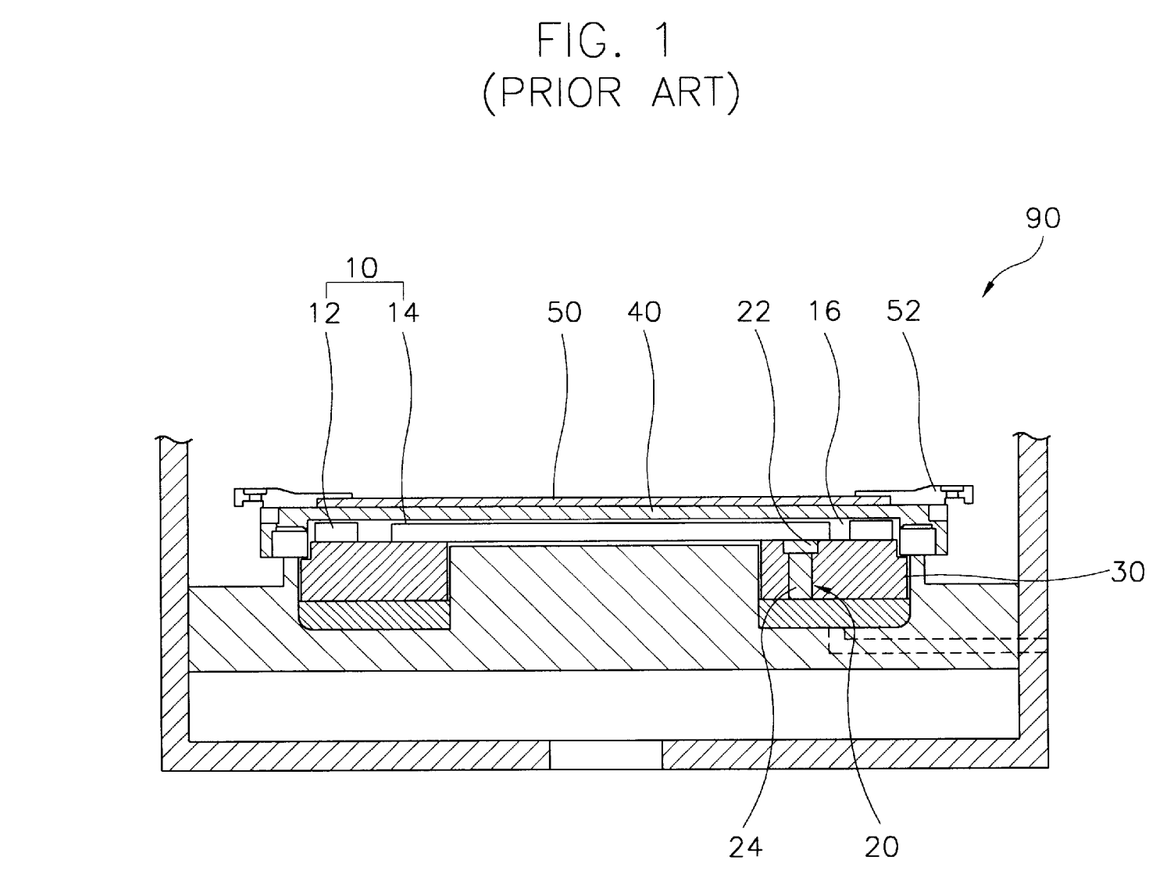
FIG. 1 is a cross-sectional view of a heater assembly of a conventional thermal CVD apparatus.
Figure 2:
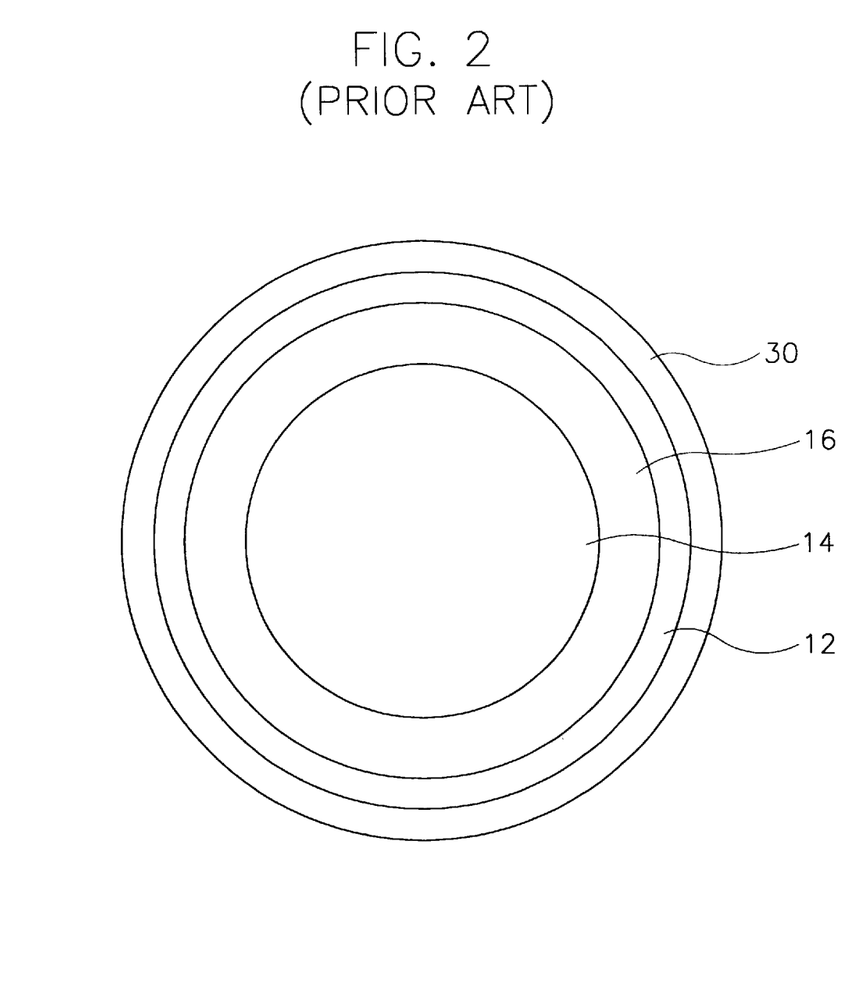
FIG. 2 is a plan view of the heater assembly shown in FIG. 1.

FIG. 1 is a schematic cross-sectional view of the conventional dual heater assembly of the GENUS 7000 thermal CVD apparatus made by GENUS Co. U.S.A. FIG. 2 is a schematic plan view of the dual heater assembly. Referring to FIGS. 1 and 2, the conventional dual heater assembly 90 includes a susceptor 40 for supporting a wafer 50, a plurality of heaters 10 disposed below the susceptor 40 for providing heat to the susceptor 40, an electrical power source for supplying electric current to the heaters 10 and a support 30 for supporting the heaters 10.

The heaters 10 include an outer heater 12 for heating a peripheral portion of the susceptor and an inner heater 14 for heating an inner portion of the susceptor. The outer heater 12 and the inner heater 14 are separated from each other by a space 16 for preventing heat transfer between the outer heater 12 and the inner heater 14. In addition, the outer heater 12 and the inner heater 14 are controlled to operate independently. Each of the heaters 10 is made of a thin plate of graphite. Heat is generated due to the internal resistance of the heaters 10 when the electric current is supplied to the heaters 10. The electrical power source includes a first source (not shown) for providing current to the outer heater 12 and a second source 20 for providing current to the inner heater 14.

The second source 20 comprises a connection member 24 for guiding electric current from an external power source to the inner heater 14, a lead member 22 which is connected to an input terminal formed on the bottom surface of the inner heater 14, and a controller (not shown) for controlling the electric current supplied through the connection member 24 and lead member 22 according to a surface temperature of the wafer 50. The lead member 22 comprises a corrosion-resistant and heat-resistant material and is screwed onto the input terminal.

The support 30 is made of quartz, which is corrosion-resistant to acid or alkali materials except hydrogen fluoride and thus, is very chemically stable. Hence, the support 30 is not easily corroded by deposition gas or other pollutants, and operates as an insulator.

When electric current is provided to the heaters 10 from the external power source via the electrical power source, heat generated from the graphite heaters 10 radiate to the susceptor 40. Subsequently, heat is conducted from the susceptor 40 to the wafer 50 disposed on top of the susceptor 40, whereby the wafer 50 is heated. In heating the wafer 50 as described above, the outer heater 12 is controlled to generate more heat than the inner heater 14.

Nonetheless, experiments show that the temperature of the wafer surface varies from the central portion to the peripheral portion of the wafer.

Figure 3:
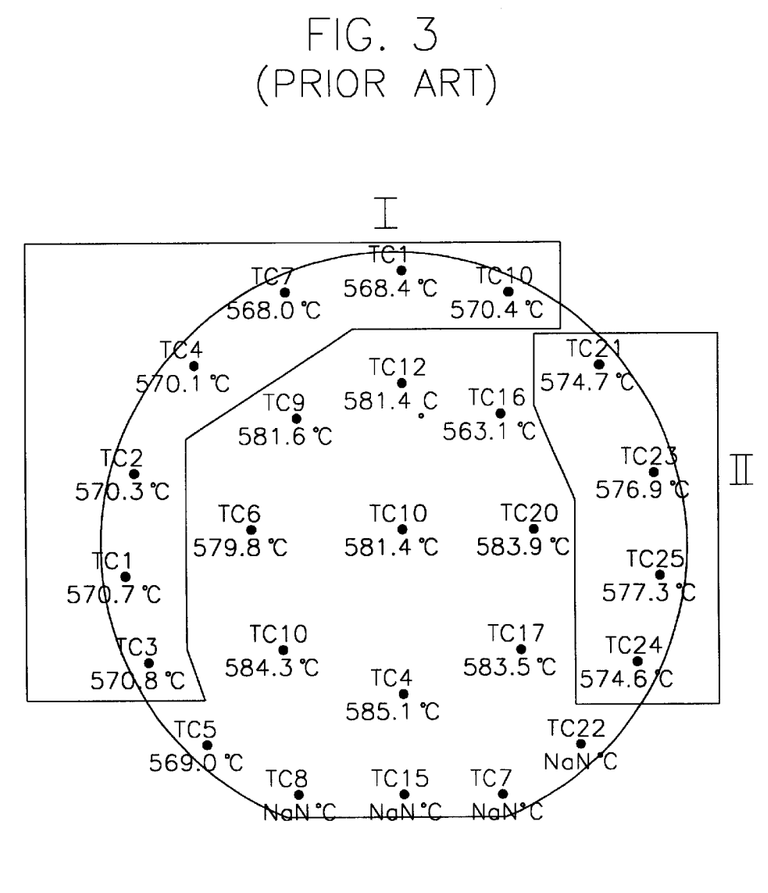
FIG. 3 is a diagram of the temperature distribution at the surface of a wafer heated by the conventional heater assembly.
Figure 4:
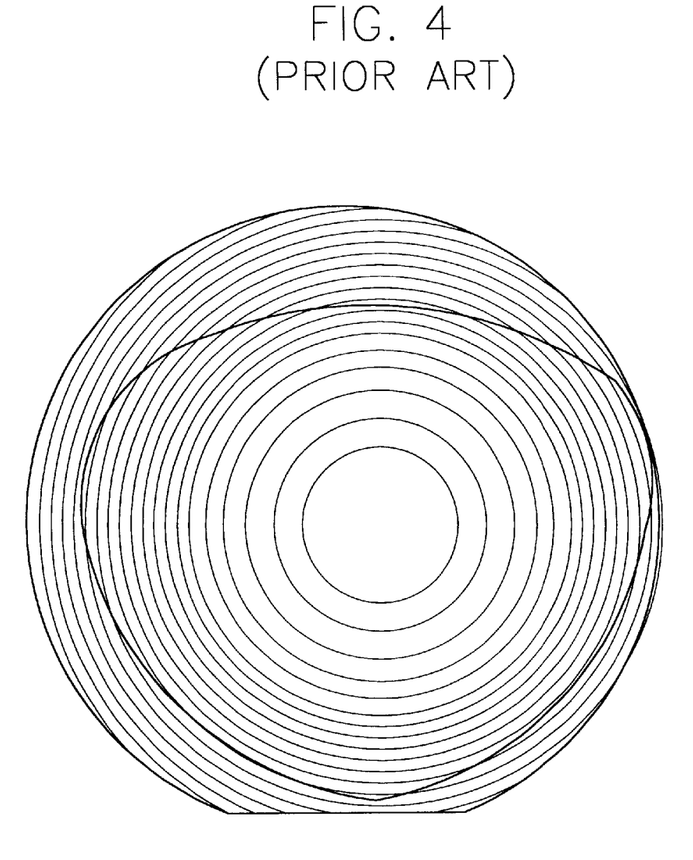
FIG. 4 is a diagram of the temperature profile of the wafer surface based on the temperature data shown in FIG. 3.

FIG. 3 shows the temperature distribution across the surface of a wafer heated by the conventional dual heater system. The temperature was measured at 25 spots on a test wafer heated by controlling the outer heater 12 and the inner heater 14 to produce a temperature difference of 20° C. FIG. 4 depicts the temperature profile of the wafer surface using the temperature data shown in FIG. 3

Referring to FIG. 3, even though the outer heater 12 was controlled to generate more heat than the inner heater 14, the temperature of wafer surface is relatively high at the central portion of the wafer and relatively low at the peripheral portion of the wafer. That is, the results shown in FIG. 3 indicate that the dual heater system cannot make the temperature of the wafer surface sufficiently uniform. Furthermore, since the input terminals of the inner and outer heaters are disposed at locations laterally offset with respect to the center of the wafer, the temperature at a region of the wafer surface closest to the input terminals ("region II" in FIG. 3) is higher than that of a region of the wafer surface remote from the input terminals ("region I" in FIG. 3). Therefore, the temperature profile is skewed towards the input terminal, as shown in FIG. 4.

The variation in the temperature across the wafer surface thus causes the thickness of the thin film formed on the wafer surface to be non-uniform. This, in turn, can cause a variety of processing defects.

Figure 5:
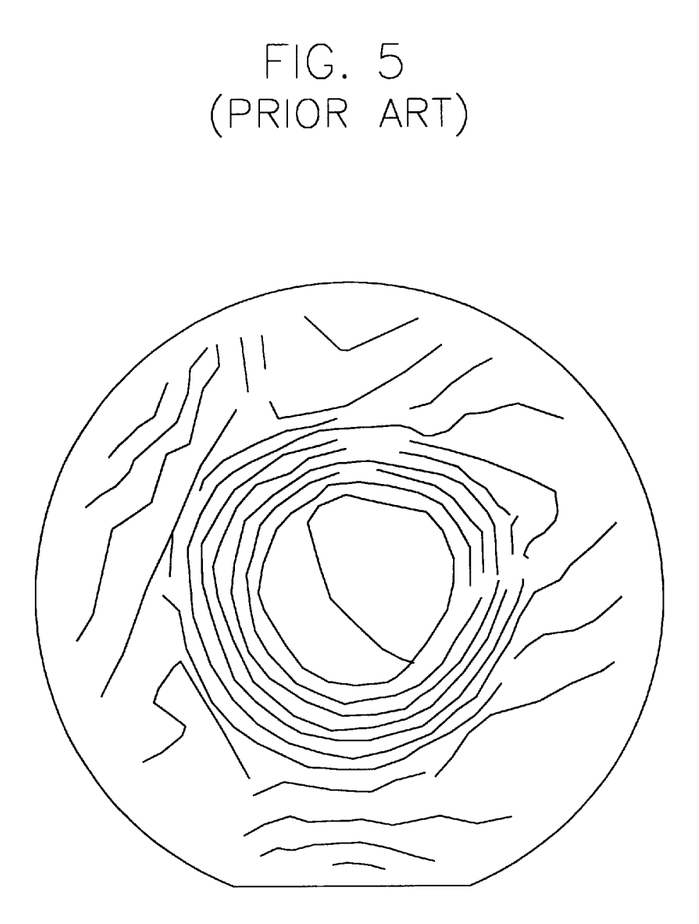
FIG. 5 is a diagram of the sheet resistance profile of the surface of the wafer heated by the conventional heater assembly.

FIG. 5 shows the sheet resistance profile of the surface of the wafer disposed on the conventional heater assembly having a dual heater system. The sheet resistance is measured at a number of spots on the surface of the wafer, and the sheet resistance profile is drawn by connecting the spots where the resistance values are the same. It is noted that the temperature profile and the sheet resistance profile have similar shapes.

When tungsten silicide is deposited to form a thin film, the sheet resistance per unit area has a relationship according to equation (1) as follows:

$$R_s = \frac{\rho}{t} \qquad (1)$$

wherein $R_s$ is the sheet resistance, $\rho$ is the bulk resistivity and t is the thickness of thin film. The sheet resistance can be easily measured using various measuring instruments. Therefore, the thickness of the film at the spot where the sheet resistance is measured can be easily calculated by using equation (1).

Figure 6:
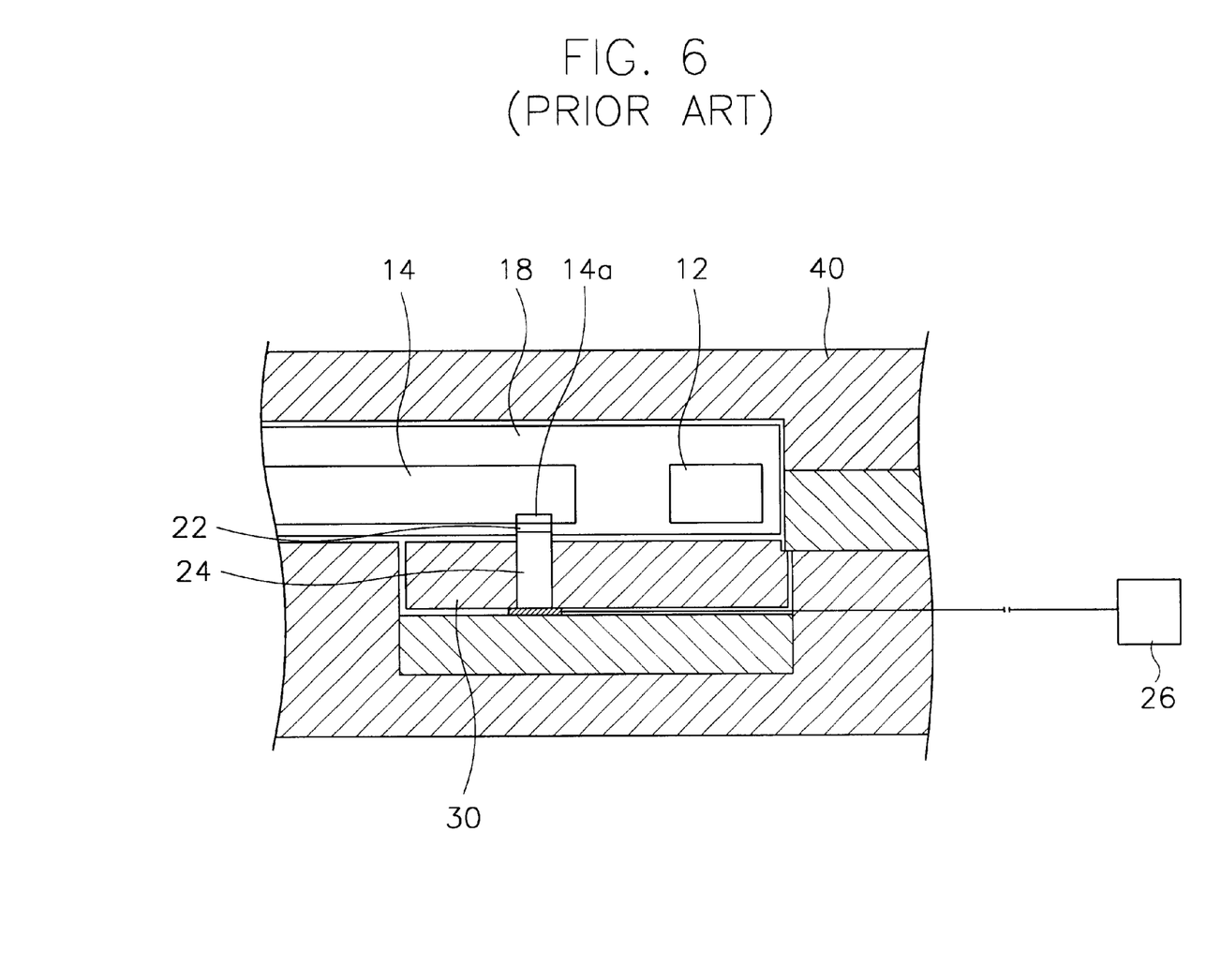
FIG. 6 is an enlarged sectional view of the second source of the conventional heater assembly shown in FIG. 1.

Also, referring to FIG. 6, the connection member 24 for conducting electric current to the inner heater 14 passes through the support 30 and contacts the lead member 22, which is connected to the input terminal 14a. The inner heater 14 and the input terminal are enclosed within an insulating layer 18 so as to be prevented from being eroded by deposition gas, by-products produced during a deposition process and ionized fluorine (F⁻) produced during the rinsing of the CVD apparatus.

However, the lead member 22 is mechanically joined with, e.g., screwed to, the input terminal 14a of the inner heater 14. Thus, deposition gas and by-products produced during the deposition process may infiltrate the insulating layer 18 through chinks in the mechanical joint between the lead member 22 and the input terminal. Consequently, the lead member 22 is not only expanded due to heat from the heater 10, but also is eroded by the deposition gas and by-products produced during the deposition process. Furthermore, the lead member 22 is eroded by ionized fluorine (F⁻) of a solution used to rinse the CVD apparatus. The thermal expansion and erosion of the lead member 22 cause the lead member 22 to crack. Therefore, electric current cannot reach the inner heater 14. Accordingly, the entire heater assembly must be changed due to a mere defect in the lead member 22.

As described in the above, even though the outer heater is independently controlled to generate more heat than the inner heater does, the temperature is not sufficiently uniform across the wafer surface. Accordingly, the thickness of a thin film formed on the wafer surface is non-uniform. In addition, the lead member of the system is prone to cracking, i.e., the useful life of the heater assembly is short.

SUMMARY OF THE INVENTION

Therefore, one object of the present invention to provide a heater assembly that minimizes the temperature difference between a peripheral portion and a central portion of the wafer. Another object of the present invention is to provide a heater assembly having a long useful life.

The heater assembly comprises a first support, e.g., a susceptor, for supporting the wafer, a heater including a unitary body of electrically resistive material for generating heat by electrical resistance, and a plurality of heat blocks dividing the upper surface of the unitary body into a plurality of heating sections, a second support disposed under and supporting the resistive heater, and an electrical power source for supplying electric current to the resistive heater.

The widths of the heating sections increase towards the center of the heater to such an extent that the electrical resistance of the peripheral portion of the heater is higher than that of the central portion of the heater.

The unitary body of resistive material has the shape of a disc, and the heating assembly further comprises an input terminal and an output terminal disposed along a diameter of the disc and connected with the electrical power source. The heating sections are contiguous to each other to form a single path for electric current between the input terminal and the output terminal.

The heat blocks include a circular outer block member extending along the outer periphery of the disc, a first block member disposed radially inwardly of the outer block member such that a first heating section is defined between the outer block member and the first block member, and a second block member disposed radially inwardly of the first block member such that a second heating section is defined between the first block member and the second block member, and a third heating section is defined radially inwardly of the second block member.

The first block member has a plurality of arcuate sections lying along a first circle and spaced from one another so as to provide a first opening and a second opening therebetween. Each of the first and second openings subtends a first angle $\theta_1$ in a circumferential direction of the disc from an imaginary line connecting the input terminal and the output terminal. Hence, the first and second openings are disposed symmetrically to one another with respect to the center of the heater.

The second block member has a plurality of arcuate sections lying along a second circle and spaced from one another so as to provide a third opening and a fourth opening therebetween. Each of the third and fourth openings subtends a second angle $\theta_2$ in the circumferential direction of the disc from the imaginary line connecting the input terminal and the output terminal. Hence, the third and fourth openings are also disposed symmetrically to one another with respect to the center of the heater.

First, second, third and fourth guide members of electrically insulating material are also integrated into the upper surface of the body of the heater so as to guide electric current to and from the heating sections at the upper surface of the heater. The first guide member connects the outer block member with the first block member at a proximal end of the first opening in the first heat block member. The fourth guide member connects the outer heat block member with the first block member at a proximal end of the fourth opening such that the first and fourth guide members are symmetrical to each other with respect to the center of the heater. The second guide member connects the second block member at a proximal end of the third opening with the first block member at a distal end of the first opening. The third guide member connects the first block member at a distal end of the third opening with the second block member at a proximal end of the third opening such that the second and third guide members are symmetrical to one another with respect to the center of the heater.

The electrical power source includes an electrical lead connected to the input terminal for conducting electric current to the heater, and an electrical connector for electrically connecting the lead to an external (driving) power source. The lead extends from the lower surface of the resistive heater downwardly through the heater support and into contact with the connector at a bottom portion of the support.

According to the present invention, the electrical resistance is higher at peripheral portion than at central portion of the heater. Accordingly, the peripheral portion of the heater generates more heat than the central portion. Consequently, the temperature difference between the peripheral portion and the central portion of the wafer can be minimized, and a thin film layer having a uniform thickness can be formed by a deposition process. Furthermore, the lead is not likely to crack and thus, the costs associated with maintaining the CVD apparatus can be kept low.

BRIEF DESCRIPTION OF THE DRAWINGS

The above and other objects, features and advantages of the present invention will become more apparent form the following detailed description of the preferred embodiments thereof made with reference to the attached drawings, of which.

DETAILED DESCRIPTION OF THE PREFERRED EMBODIMENTS

Now, preferred embodiments of a heater assembly of a CVD apparatus according to the present invention will be described in detail with reference to the attached drawings.

Figure 7:
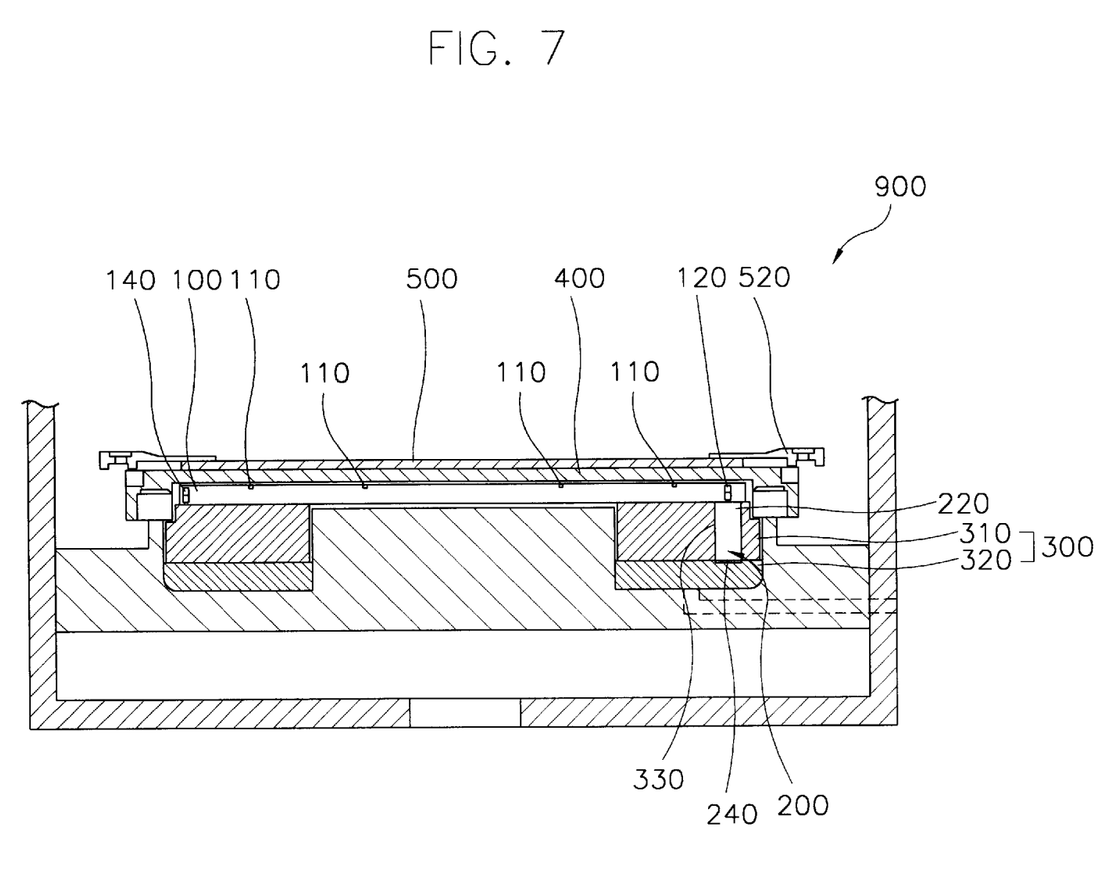
FIG. 7 is a cross-sectional view of a heater assembly of a CVD apparatus according to the present invention.

Referring to FIG. 7, a first embodiment of the heater assembly 900 includes a susceptor 400 for supporting a wafer on which a thin film layer is to be formed, a unitary resistive heater 100 disposed under the susceptor 400 for providing heat to the susceptor 400, an electrical power source 200 for supplying electric current to the unitary resistive heater 100, and a support 300 for supporting the heater 100.

The heater 100 comprises a unitary disc of graphite having a thickness of about 0.1 mm to 0.3 mm. Heat is generated due to internal resistance of the heater 100 when electric current is supplied to the heater 100.

A plurality of heat blocks (insulating members) 110 are embedded in or otherwise integrated on a surface of the heater 100 such that the surface of the heater 100 is divided into several heating sections whose widths increase, respectively, towards the center of the heater 100. An input terminal 120 and an output terminal 140 are disposed at peripheral portions of the heater 100 symmetrically with respect to the center of the heater 100. The input terminal 120 is connected to the electrical power source 200. Preferably, a protecting layer is formed on the surface of the heater 100 so as to prevent it from being eroded by deposition gas, rinsing gas and other pollutants.

The heat blocks 110 comprise a thermal insulating material such as boron nitride. The heat blocks 110 thus prevent heat or electric current from being transferred between neighboring heating sections. Consequently, each of the heating sections functions as an independent heating unit. That is, electric current supplied to each heating section of the heater 100 passes only through that heating section, and the heat generated in each heating section radiates only upwardly, i.e., vertically without flowing horizontally to neighboring heating sections.

More specifically, when electric current is supplied to the heater 100, heat is generated by each of the heating sections according to Joule's Law and radiates only upwardly to the susceptor 400 to heat the wafer 500. Therefore, the amount of heat supplied to the central portion of the susceptor 400 and the amount of heat supplied to the peripheral portion of the susceptor 400 can be established by designing the width of the heating sections appropriately.

In particular, the heat blocks 110 at the outer peripheral portion of the heater 100 are spaced radially from one another by relatively small intervals. Therefore, the long heating section at the outer peripheral portion of the heater 100 has a relatively small width. On the other hand, the heat blocks 110 at the central portion of the heater 100 are spaced radially from one another by greater intervals so that the relatively short heating section defined therebetween has a large width. The heating section at the peripheral portion of the heater 100 thus has a cross-sectional area that is smaller than that of the heating section at the central portion of heater 100. The resistance of the heating section at the peripheral portion of the heater 100 is larger than that of the heating section at the central portion of heater 100 because electric resistance is in inversely proportional to the cross-sectional area of a resistive body. As a result, if the amount of current supplied to the heater 100 is constant, the heating section at the peripheral portion of the heater 100 generates more heat than the heating section at the central portion of the heater 100.

Accordingly, the heat blocks 110 are designed, e.g., shaped or spaced from one another at the surface of the heater 100, such that the peripheral portion of the heater 100 can generate enough heat to compensate for the heat lost from the side surface of the wafer 500. Therefore, the wafer surface is heated so that there is very little temperature difference amongst the various portions of the wafer surface.

Figure 11:
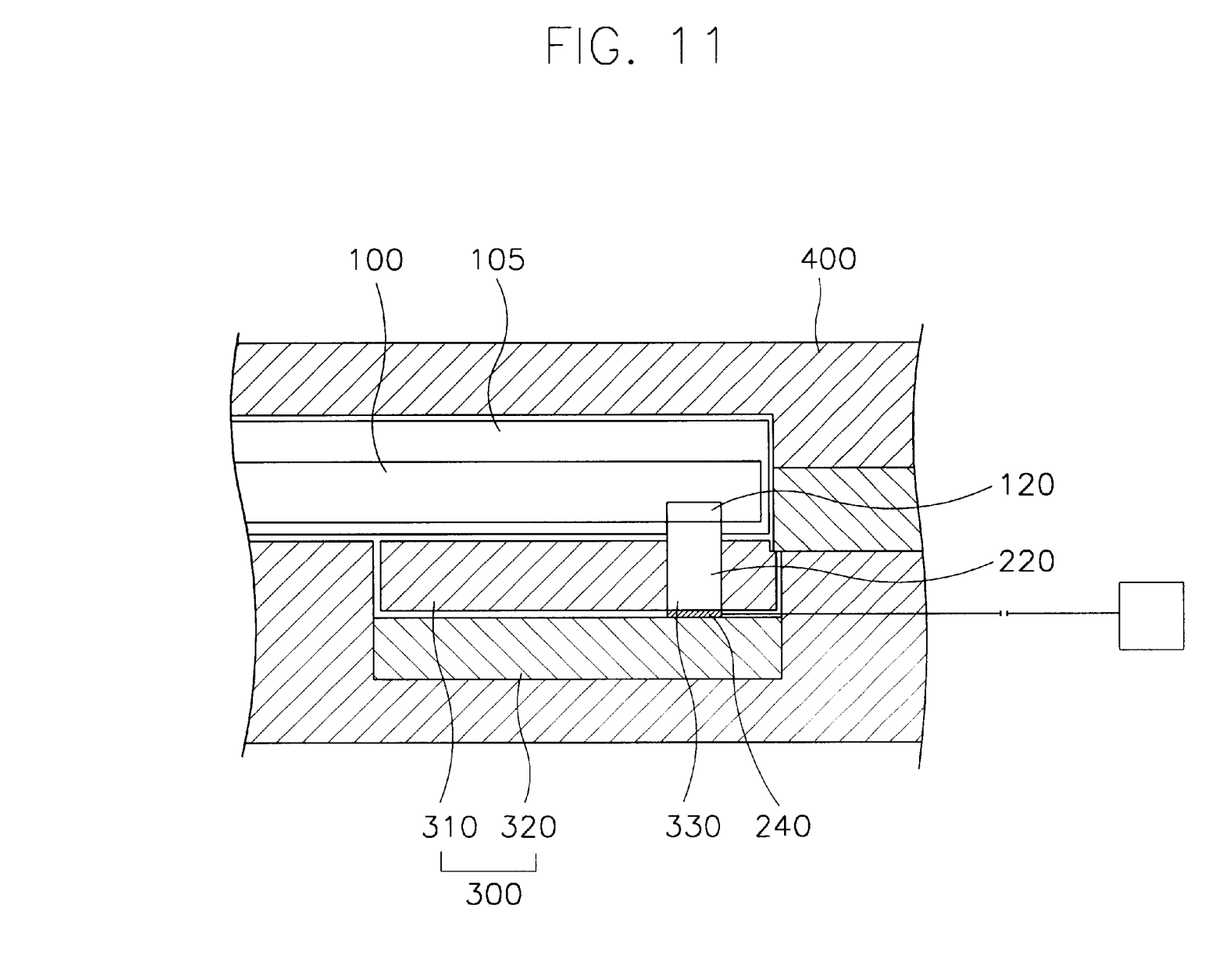
FIG. 11 is an enlarged view of the electrical power source of the heater assembly shown in FIG. 7.

Referring now to both FIGS. 7 and 11, the electrical power source 200 includes a lead member 220, which is connected to the input terminal 120 and conducts electric current to the heater 100, a connection member 240 for conducting electric current from an external source (not shown) to the lead member 220, and a control (not shown) for controlling the electric current according to the surface temperature of the wafer 500. The control measures the temperature of the wafer surface and compares the measured temperature to a standard temperature. If the measured temperature is greater than the standard temperature, the control interrupts the supply of current form the external source to the connection member 240. Accordingly, the control member can prevent the wafer 500 from being excessively heated.

The lead member 220 is connected, e.g., is threaded, to the input terminal 120 formed on bottom surface of the heater 100, and is rod-shaped in one form of the present invention. The lead member 220 extends downwardly through the support 300 and into contact with the connection member 240. Also, the lead member 220 comprises a corrosion-resistant and heat-resistant material so that it will not be damaged by deposition gas, impure gas or heat. To this end, the lead member 220 is preferably made of boron nitride. The connection member 240 is disposed on a bottom portion of the support 300 and electric current is supplied thereto from an external power source (see FIG. 11). Preferably, the external power source is an alternating current RF power source.

The support 300 comprises quartz, which is a chemically stable material that will not be corroded by acid or an alkali material except for hydrogen fluoride. Hence, the support 300 is not easily corroded by the deposition gas or other by-products of the deposition process. The support 300 includes an upper support member 310 for supporting the heater 100 and a lower support member 320 for supporting the upper support member 310. The lower support member 320 has an injection hole for injecting argon gas towards a bottom surface of the heater 100 so as to prevent the deposition gas or other by-products of the chemical reaction from flowing to the bottom surface of the heater 100. The connection member 240 is interposed between the upper support member 310 and the lower support member 320. The lead member 220 extends through a hole in the upper support member 310, and into contact with the connection member 240.

Also, a protective layer 105 is formed on the surface of the heater 100 so as to prevent the heater 100 from being eroded by the deposition gas or other pollutants present during the deposition process. The protective layer 105 may extend over a surface of the lead member 220 at the location where the lead member 220 is joined to the input terminal 120.

Unlike the conventional heater assembly, the lead member 220 extends all the way to the bottom portion of the support 300. Hence, the lead member 220 is prevented from being damaged by thermal stress created due to the operation of the heater 100. Furthermore, the portion at which the input terminal 120 of the heater 100 and the lead member 220 are connected to each other will not be damaged by the deposition gas or by-products of the chemical reaction occurring during the deposition process.

Figure 8:
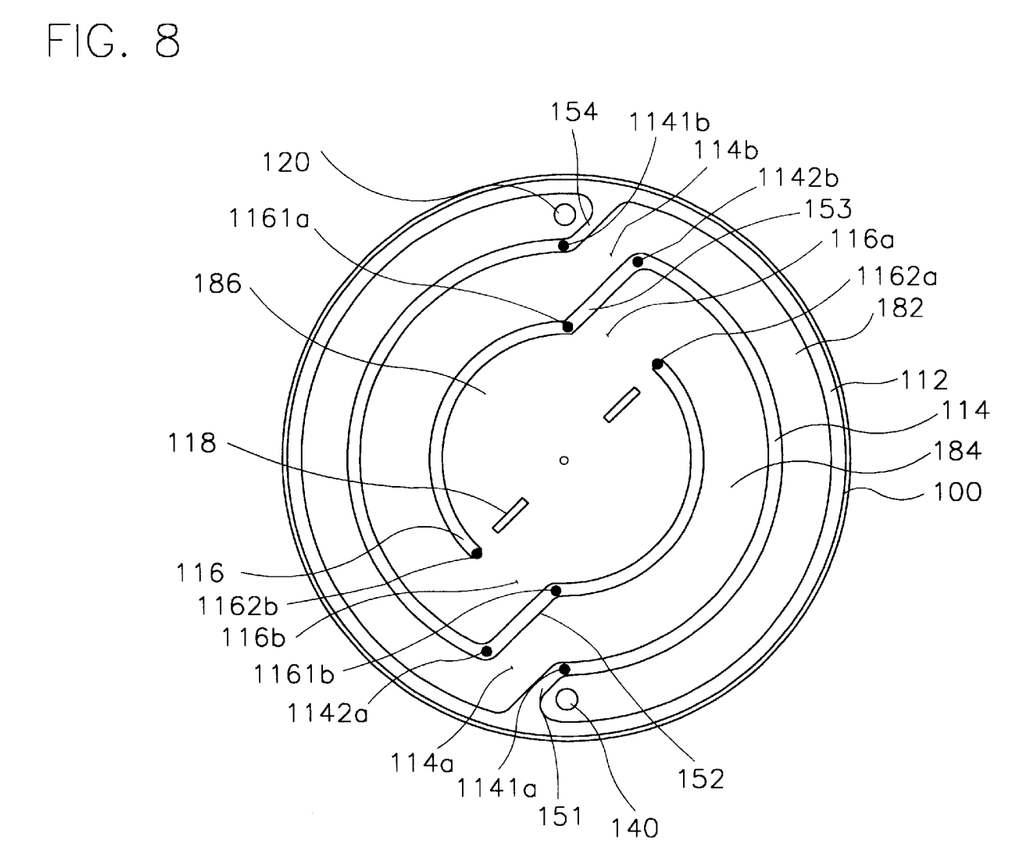
FIG. 8 is a plan view of the heater of the heater assembly according to the present invention, as divided by heat block members into a plurality of heating sections.

FIG. 8 shows the heater 100 in detail divided into heating sections of different cross-sectional areas according to the present invention. Referring to FIG. 8, the unitary resistive heater 100 includes three heating sections on the surface thereof. The input terminal 120 and output terminal 140 are disposed diametrically across from one another and are connected to the electrical power source 200. The heat blocks are in the form of a circle and a plurality of concentric arcs whose radii of curvature emanate from the center of the heater. And, the heating sections are contiguous to each other so that current flows along a single path between the input terminal 120 and the output terminal 140. The intervals between the heat blocks, i.e., the distances between the adjacent heat blocks in the radial direction, increase towards the center of the heater 100 such that widths of the heating sections also increase towards the center of the heater 100.

The heat blocks 110 comprise an outer block member 112, a first block member 114, and a second block member 116, which are concentric about the center of the heater 100. The outer block member 112 extends along the outer peripheral portion of the heater 100 so as to be circular. The first block member 114 has the form of two arcs lying along a circle whose radius is smaller than that of the outer block member 112. Thus, a first heating section 182 is that portion of the heater 100 located between the outer block member 112 and the first block member 114. The second block member 116 has the form of two arcs lying along a circle having a radius smaller than that of the first block member 114. Thus, a second heating section 184 is that portion of the heater 100 located between the first block member 114 and the second block member 116, and a third heating section 186 is that portion of the heater 100 located between the center of the heater 100 and the second block member 116.

As was described above, the cross-sectional areas of the first, second, and third heating sections 182, 184, and 186 increase towards the center of the heater 100. Generally, the resistance of a resistive body is inversely proportional to the cross-sectional area through which a current passes, as shown in the following Equation (2):

$$R = \rho \frac{l}{s} \qquad (2)$$

wherein R denotes the resistance of the resistive body, ρ denotes the specific resistance of the resistive body, l denotes the length of the resistive body, and s denotes the cross-sectional area of the resistive body.

The resistances of the heating sections 182, 184, 186 become significantly smaller towards the center of the disc as the cross-sectional areas of the heating sections become larger and the lengths (as measured in circumferential direction of the heater) of the heating sections become smaller towards the center of the heater 100. Preferably, the widths and l lengths of the heating sections are set such that the resistances of the heating sections are in a ratio of about 1:2:4 towards the center of the heater 100.

According to the Joule's Law, heat generated from a resistive body through which a current passes is proportional to the resistance of the resistive body, as shown in the following Equation (3):

$$Q = i^2 R t \qquad (3)$$

wherein i denotes the current passing through the resistive body, R denotes the resistance of the resistive body, and t denotes the time during which the current flows through the resistive body.

Consequently, even though a constant current is supplied to the unitary resistive heater 100, the heating sections 182, 184, 186 generate different amounts of heat.

Still further, the first and second block members 114 and 116 each can be seen as having the shape of a discontinuous circle, i.e., a circle having a plurality of openings, for allowing the current to pass between the heating sections.

A first opening 114a allows the electric current supplied to the input terminal 120 to pass from the first heating section 182 to the second heating section 184, and a third opening 116a allows the current to pass from the second heating section 184 to the third heating section 186. Also, a fourth opening 116b allows the current to pass from the third heating section 186 to the second heating section 184, and a second opening 114b allows the current to pass from the second heating section 184 to the first heating section 182. The first and second openings 114a and 114b are missing segments of the circle along which the first block member 114 lies, and the third and fourth opening portions 116a and 116b are missing segments of the circle along which the second block member 116 lies.

Figure 9:
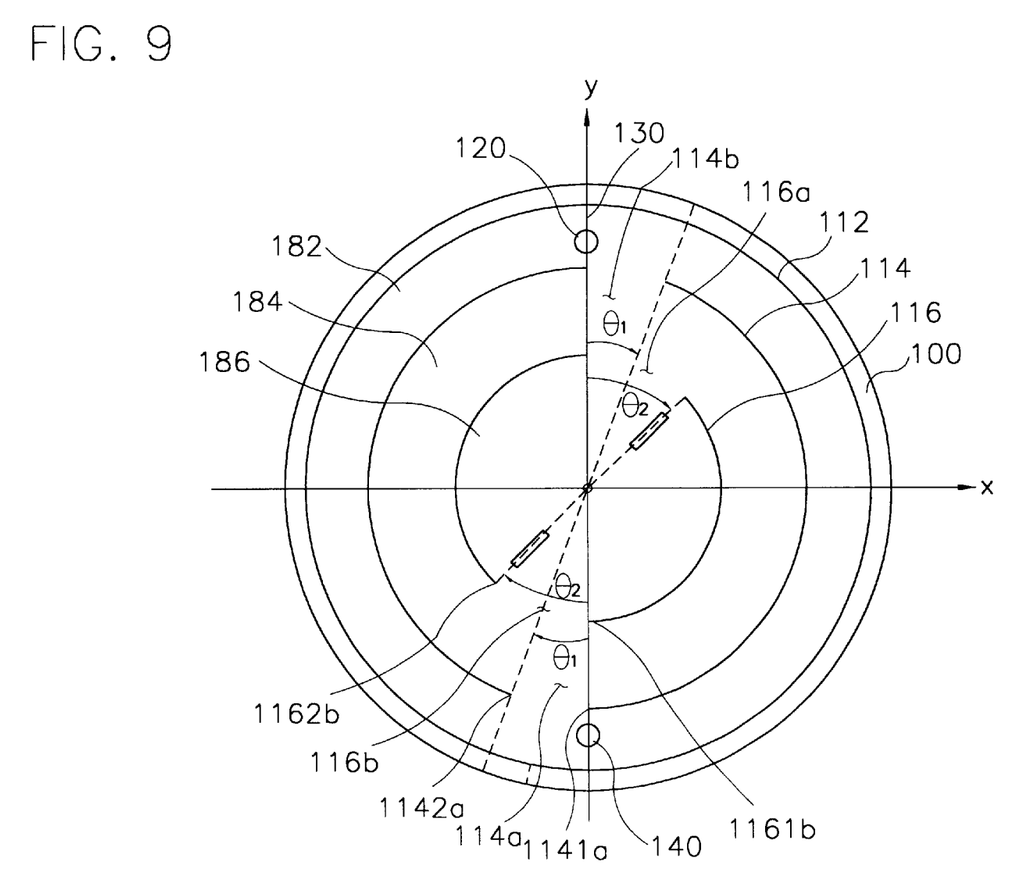
FIG. 9 is a schematic diagram of the heater illustrating the design of openings in respective ones of the heat block members.

Referring to the FIG. 9, the input terminal 120 and the output terminal 140 are disposed on peripheral portions of the heater 100 symmetrically with respect to the center of the (disc) heater 100, whereby the input terminal 120 and the output terminal 140 lie along a diameter 130 of the disc.

The following description will be made with reference to rectangular coordinates having the center of the heater 100 as the origin thereof. In the rectangular coordinate system, the line 130 along which the terminals 120 and 140 lie is regarded as the y-axis.

In an embodiment of the present invention, the first opening 114a is located in the third quadrant of the rectangular coordinate system and subtends a first angle ($\theta_1$) in a clockwise direction from the y-axis. The second opening 114b is located in the first quadrant of the rectangular coordinate system and similarly subtends the angle ($\theta_1$) in a clockwise direction from the y-axis. The first angle ($\theta_1$) is large enough to allow sufficient current to pass between the first 182 and second 184 heating sections. Preferably, the first angle ($\theta_1$) is about 10° to 20°.

Further, the third opening 116a is located in the first quadrant of the rectangular coordinate system and subtends a second angle ($\theta_2$) measured clockwise from the y-axis. The fourth opening 116b is formed in the third quadrant of the rectangular coordinate system and similarly subtends the angle ($\theta_2$) clockwise from the y-axis. The second angle ($\theta_2$) is established to satisfy the following Equation (4):

$$\theta_2 = \frac{r_1}{r_2} \theta_1 \qquad (4)$$

wherein $r_1$ denotes the radius of the first block member, and $r_2$ denotes the radius of the second block member.

Consequently, the first opening 114a and the second opening 114b are symmetrical with respect to the center of the heater 100, as are the third opening 116a and the fourth opening 116b.

The heater 100 also includes a plurality of guide members 151, 152, 153, 154 for guiding the electric current to and from the heating sections. In the description that follows, the proximal end of an opening refers to that which is closest to the y-axis, whereas the distal end the opening refers to that which is furthest away from the y-axis.

A first guide member 151 connects the outer block member 112 to the first block member 114 at the proximal end 1141a of the first opening portion 114a. The first guide member 151 guides the electric current from the first heating section 182 to the second heating section 184 by essentially blocking the flow of current onward through the first heating section 182. A second guide member 152 connects the first block member 114 to the second block member 116 between the distal end 1142a of the first opening 114a and the proximal end 1161b of the fourth opening 116b. The second guide member 152 causes the electric current to flow in one direction in the second heating section 184. In addition, a third guide member 153 connects the first block member 114 to the second block member 116 between the proximal end 1161a of the third opening 116a and the distal end 1142b of the second opening 114b. The third guide member 153 guides the electric current passing through the second heating section 184 to the third heating section 186 by essentially blocking the flow of current onward through the second heating section 184. A fourth guide member 154 connects the outer block member 112 to the first block member 114 at the proximal end 1141b of the second opening 114b. The fourth guide member 154 guides the current from the second heating section 184 to the first heating section 182 so that the electric current flows to the output terminal 140 without passing to the input terminal 120. The first, second, third and fourth guide members 151 to 154 comprise the same insulating material as that of the outer block member 112 or the first and second block members 114 and 116 so as to prevent heat and electricity from being transferred therethrough.

The first guide member 151 extends longitudinally in a direction having a positive slope in the third quadrant, and the output terminal 140 is disposed on the right side thereof. The second guide member 152 extends parallel to the first guide member 151, and the first opening 114*a* and the fourth opening 116*b* have the same arc length, i.e., length as measured in the circumferential direction of the heater 100. In addition, the fourth guide member 154 extends longitudinally in a direction having a positive slope in the first quadrant, and the input terminal 120 is disposed on the left side thereof. The third guide member 153 extends parallel to the fourth guide member 154, and the second opening 114*b* and the third opening 116*a* have the same arc length. Consequently, the first guide member 151 and the fourth guide member 154 are symmetrical with each other with respect to the center of the heater 100, and so are the second guide member 152 and the third guide member 153.

As described above, the block members 112, 114,116, the guide members 151, 152, 153, 154, and the openings 114*a*, 114*b*, 116*a*, 116*b* are symmetrical with respect to the center of the heater 100. Accordingly, the first, second, and third heating sections 182, 184, and 186 each have the same surface area in first and second semicircular portions of the heater 100. The first semicircular portion of the heater 100 is that portion to the left of the heater 100 and the second semicircular portion is that to the right of the y-axis. Equal amounts of heat are thus generated in the first and second semicircular portions.

Preferably, a third block member 118 extends longitudinally in the third heating section 186 along a line that connects the distal end 1162*b* of the fourth opening 116*b* with the distal end 1162*a* of the third opening 116*a* so that heat is generated symmetrically in the third heating section 186. The third block member 118 is shorter than the diameter of the third heating section 186, and has an opening therethrough at the center of the heater 100. The electric current entering the third heating section 186 passes through the opening in the third block member 118 at the heater center, and from there flows to the second heating section 184 through the fourth opening 116*b*.

Figure 10:
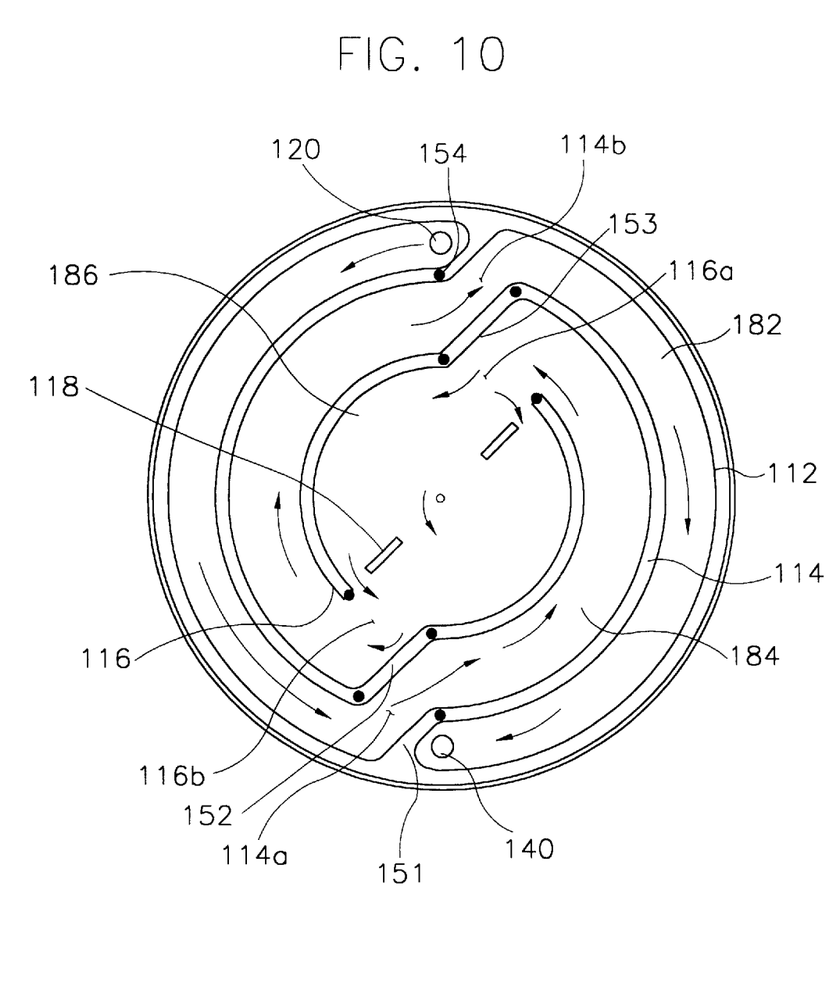
FIG. 10 is another plan view of the heater showing the flow of electric current along the upper surface of the heater.

FIG. 10 shows the flow of electric current on the surface of the heater 100.

Referring to FIG. 10, when the electric current is supplied to the input terminal 120, the electric current passes through the first heating section 182 in the second and third quadrants, i.e., in the first semicircular portion of the heater 100. Here, the outer block member 112, the first block member 114 and the fourth guide member 154 guide the electric current.

Then, the current flows into the second heating section 184 through the first opening 114*a*. At this time, the first guide member 151 prevents the current from passing through the output terminal 140 and guides the current to the second heating section 184. Simultaneously, the second guide member 152 prevents the current from flowing into that portion of the second heating section located in the first semicircular portion of the heater 100, and instead guides the current into that portion of the second heating section located in the second semicircular portion of the heater 100.

Subsequently, the current flows into the third heating section 186 from the second heating section 184 via the third opening 116*a*, entering that portion of the third heating section 186 located in the second semicircular portion of the heater 100. At this time, the third guide member 118 blocks the electric current.

However, the electric current passes through the opening in the third block member 118 at the center of the heater, and through openings at both ends of the third block member 118. From there, the current flows into the second heating section 184 through the fourth opening 116*b*. The second guide member 152 guides the current into that portion of the second heating section 184 located in the first semicircular portion.

The electric current then flows into the first heating section 182 through the second opening portion 114*b*. At this time, the third guide member 153 guides the electric current through the second opening 114*b*. In addition, the fourth guide member 154 prevents the current from passing through the input terminal 120, and guides the electric current to that portion of the first heating section 182 in the second semicircular portion of the heater.

Finally, the electric current passes through the output terminal 140 in the first heating section 182, thereby completing an electric circuit.

In the description above, the openings are located along first and second angles $\theta_1$ and $\theta_2$ measured clockwise with reference to the y-axis 130 along which the input 120 and output 140 terminals are disposed. However, the disposition of the openings and the block members may be reversed according to the present invention as such will not later the distribution of the resistive heat.

That is, the openings 114*a*, 114*b* and the openings 116*a*, 116*b* can be laid out along a first angle $\theta_1$ and a second angle $\theta_2$, respectively, that are taken counter-clockwise from the y-axis. In this case, the heater 100 has the same structure as that of the embodiment shown in FIG. 8, except that the openings 114*a*, 114*b*, 116*a* and 116*b* and the guide members 151 to 154 are disposed symmetrically with reference to the y-axis as compared with the embodiment shown in FIG. 8. Consequently, the electric current flows in a direction opposite to that shown in FIG. 10.

Furthermore, although the surface of the heater 100 is divided into three heating sections in the first embodiment of the present invention, the surface of the heater 100 may be divided into more than three heating sections according to the present invention. In addition, although the input and output terminal 120 and 140 are disposed along a diametrical line of the heater 100 in the first embodiment of the present invention, the input and output terminal 120 and 140 may be disposed otherwise as becomes necessary.

According to a preferred embodiment of the present invention, a plurality of heating sections are formed on the surface of the unitary resistive heater in such a manner that the width of the heating section at the central portion of the heater is greater than that of the heating section at the peripheral portion of the heater. Therefore, the electrical resistance of the heater is also greater at the peripheral portion thereof than at the central portion. Thus, according to the Joule's Law, more heat will be generated at the peripheral portion of the heater. As a result, a minimal temperature difference exists between the peripheral portion and the central portion of the wafer. Further, the lead member for supplying the electric current to the heater extends from the bottom surface of the heater all the way to the bottom portion of the support. Therefore, the lead member is will not be damaged, e.g., cracked, by thermal stress and will not be corroded by deposition gas and other by-products of the deposition process.

Accordingly, the temperature distribution over the surface of the wafer being processed is uniform. Furthermore, the lead member has a long useful life and hence, contributes to keeping the maintenance cost of the semiconductor device manufacturing apparatus low.

Although the present invention has been described in detail above, various changes, substitutions and alterations can be made thereto without departing from the true spirit and scope of the invention as defined by the appended claims.

What is claimed is:

1. A heater assembly of an apparatus for heating an object, comprising:

a first support dedicated to support the object;

a heater disposed below said first support, said heater comprising a unitary body of electrically resistive material, and a plurality of heat blocks integrated into an upper surface of said unitary body, said heat blocks each comprising an electrical insulator and being spaced from one another in the radial direction of the upper surface of said body so as to divide the body into a plurality of heating sections defined between the heat blocks at the upper surface of the body, the respective widths of said heating sections, as measured in the radial direction of the body, increasing towards the center of said body, and the electrical resistance of an outer peripheral portion of said heater being higher than that of a central portion of said heater; and an electrical power source connected to said heater and through which electric current can be supplied to said heater.

2. The heater assembly of claim 1, wherein said unitary body is a circular disc of electrically resistive material.

3. The heater assembly of claim 2, wherein said heater further comprises an input terminal and an output terminal integral with said disc, said terminals are connected to said power source so as to supply current to said electrically resistive material, said terminals are disposed along a diametrical line of said disk, and said heating sections are contiguous and form a single path along which current can flow between said input terminal and said output terminal.

4. The heater assembly of claim 3, wherein said heat blocks comprise a circular outer block member extending along the outer periphery of said disc, a first block member disposed radially inwardly of said outer block member such that a first one of said heating sections is defined between said outer block member and said first block member, and a second block member disposed radially inwardly of said first block member such that a second one of said heating sections is defined between said first block member and said second block member, and a third heating section is defined radially inwardly of said second block member, said first block member having the form of a plurality of arcs lying along a first circle and spaced from one another so as to provide a first opening and a second opening therebetween, each of said first and second openings subtending a first angle $\theta_1$ in a circumferential direction of the disc from an imaginary line connecting said input terminal and said output terminal, and said first and second openings being symmetrical to one another with respect to the center of said heater, a second block member having the form of a plurality of arcs lying along a second circle and spaced from one another so as to provide a third opening and a fourth opening therebetween, each of said third and fourth openings subtending a second angle $\theta_2$ in the circumferential direction of said disc from said imaginary line, and said third and fourth openings being symmetrical to one another with respect to the center of said heater, and further comprising first, second, third and fourth guide members of electrically insulating material integrated into the upper surface of said disc so as to guide electric current supplied to said disc to and from said heating sections at the upper surface of said disc, said first guide member connecting said outer block member with said first block member at an end of said first opening proximate said imaginary line, said fourth guide member connecting said outer block member with said first block member at an end of said second opening proximate said imaginary line such that said first and fourth guide members are symmetrical to each other with respect to the center of said heater, said second guide member connecting said second block member at an end of said fourth opening proximate said imaginary line with said first block member at an end of said first opening remote from said imaginary line, and said third guide member connecting said first block member at an end of said second opening remote from said imaginary line with said second block member at an end of said third opening proximate said imaginary line such that said second and third guide members are symmetrical to one another with respect to the center of said heater.

5. The heater assembly of claim 4, wherein the electrical resistances of said first heating section, said second heating section and said third heating section are in a ratio of about 1:2:4.

6. The heater assembly of claim 4, wherein said first angle $\theta_1$ is in a range of about 10 degrees to 20 degrees, and said second angle $\theta_2$ satisfies the following equation:

$$\theta_2 = \frac{r_1}{r_2}\theta_1$$

wherein $r_1$ denotes the radius of said first circle, and $r_2$ denotes the radius of said second circle.

7. The heater assembly of claim 4, and further comprising a third block member of electrically insulating material disposed in said third heating section and dividing said third heating section into sub-sections that are symmetrical to one another with respect to the center of said heater, said third block member extending longitudinally along a line that connects an end of said third opening remote from said imaginary line with an end of said fourth opening remote from said imaginary line, said third block member having a length shorter than the diameter of said third heating section.

8. The heater assembly of claim 1, wherein said heat blocks are each of boron nitride.

9. The heater assembly of claim 1, wherein said electrical power source includes an electrical lead connected to said input terminal and through which electric current is supplied to said heater, and an electrical connector for electrically connecting said lead to an external power source.

10. The heater assembly of claim 9, and further comprising a second support that supports said heater, and wherein said lead extends from a lower surface of said disc downwardly through said second support and into contact with said connector at a bottom portion of said second support.

11. The heater assembly of claim 10, wherein said second support is of quartz.

12. The heater assembly of claim 1, wherein said heater further comprises an input terminal and an output terminal integral with said unitary body, said electrical power source being connected to said input terminal, and said heating sections being electrically conductively connected to one another along a path along which current can flow from said input terminal to said output terminal.

* * * * *